(12) United States Patent
Zur

(10) Patent No.: US 6,714,807 B2
(45) Date of Patent: Mar. 30, 2004

(54) MAGNETIC RESONANCE IMAGING SYSTEM

(75) Inventor: Yuval Zur, Haifa (IL)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 224 days.

(21) Appl. No.: 09/896,764

(22) Filed: Jun. 29, 2001

(65) Prior Publication Data

US 2003/0055329 A1 Mar. 20, 2003

(51) Int. Cl.$^7$ .............................................. A61B 5/055
(52) U.S. Cl. ..................... 600/410; 128/898; 324/307; 324/309; 324/312; 324/314; 382/128
(58) Field of Search ................................ 600/407, 410; 324/307, 309, 312, 314, 300; 128/898; 382/128

(56) References Cited

U.S. PATENT DOCUMENTS

| | | | | |
|---|---|---|---|---|
| 4,115,730 A | * | 9/1978 | Mansfield | .................... 324/309 |
| 4,716,367 A | * | 12/1987 | Patz | ........................... 324/306 |
| 5,668,474 A | | 9/1997 | Heid | |
| 6,307,368 B1 | * | 10/2001 | Vasanawala et al. | ........ 324/300 |

OTHER PUBLICATIONS

"Linear Combination steady–State Free Precession MRI", by S.S. Vasanawala et al., in Magnetic Resonance in Medicine 43, pp. 82–90, (2000).
J.L. Duerk et al., Magnetic Resonance Imaging 8, 203–208 (1998).
S.S. Vasanawala, et al., Magnetic Resonance in Medicine, 42, pp. 876–883, (1999).
S.B. Reeder, et al., Magnetic Resonance in Medicine, 41 pp. 87–94, (1999).
"Multi–Excitation SSFP Imaging", by Y. Zur, Proc. Intl. Soc. Magnetic Resonance Medicine 9, p. 1 (2000).
"Motion–Insensitive, Steady–State Free Precession Imaging", by Zur et al., in Magnetic Resonance in Medicine 16 (1990).

* cited by examiner

Primary Examiner—Dennis Ruhl
Assistant Examiner—Jeoyuh Lin
(74) Attorney, Agent, or Firm—Ziolkowski Patent Solutions Group, LLC; Michael A. Della Penna; Carl B. Horton

(57) ABSTRACT

A method for performing MRI, including imposing N sets of steady-state free precession (SSFP) sequences on an object to be imaged, the sequences including respective initial radio-frequency (RF) excitation pulses, each initial RF excitation pulse having a predetermined phase shift relative to the other initial RF excitation pulses. N is a whole number larger than one and less than six. The method further includes setting the phase shift of the RF pulse of the sequences so that the phase shift of the RF pulse of an $M^{th}$ sequence is substantially equal to $$\frac{2\pi(M-1)}{N}$$

radians, wherein M is a whole number larger than 0 and less than or equal to N, receiving a respective set of image signals from the object responsive to the N sets of SSFP sequences, and processing the set of received image signals to generate an image of the object.

30 Claims, 8 Drawing Sheets

FIG. 5
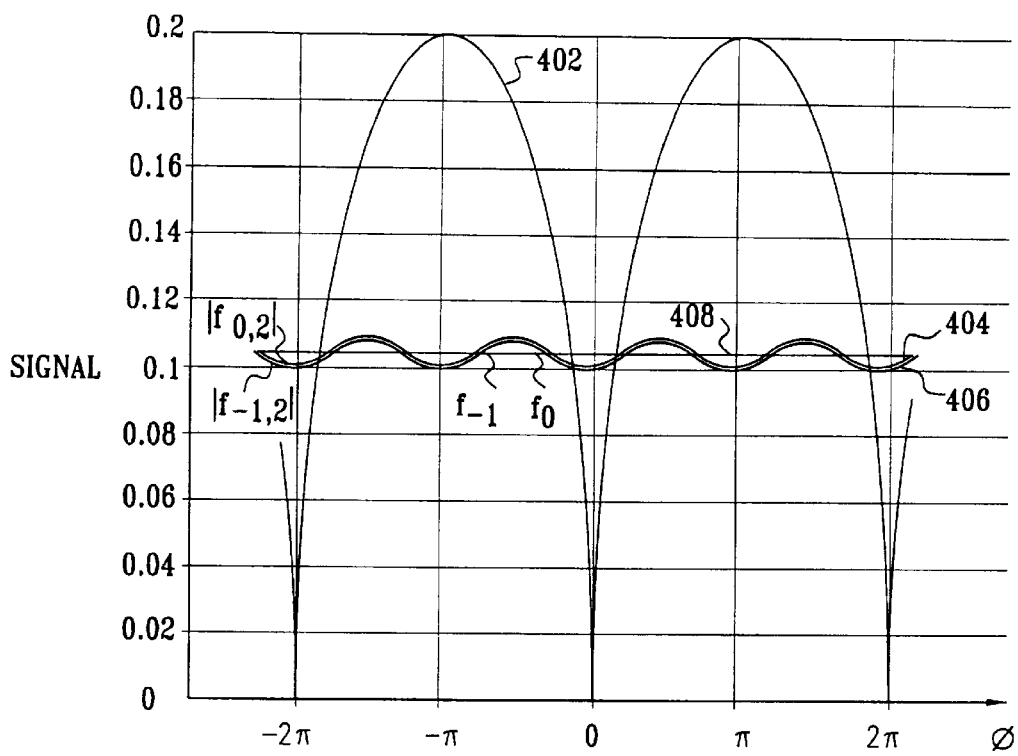
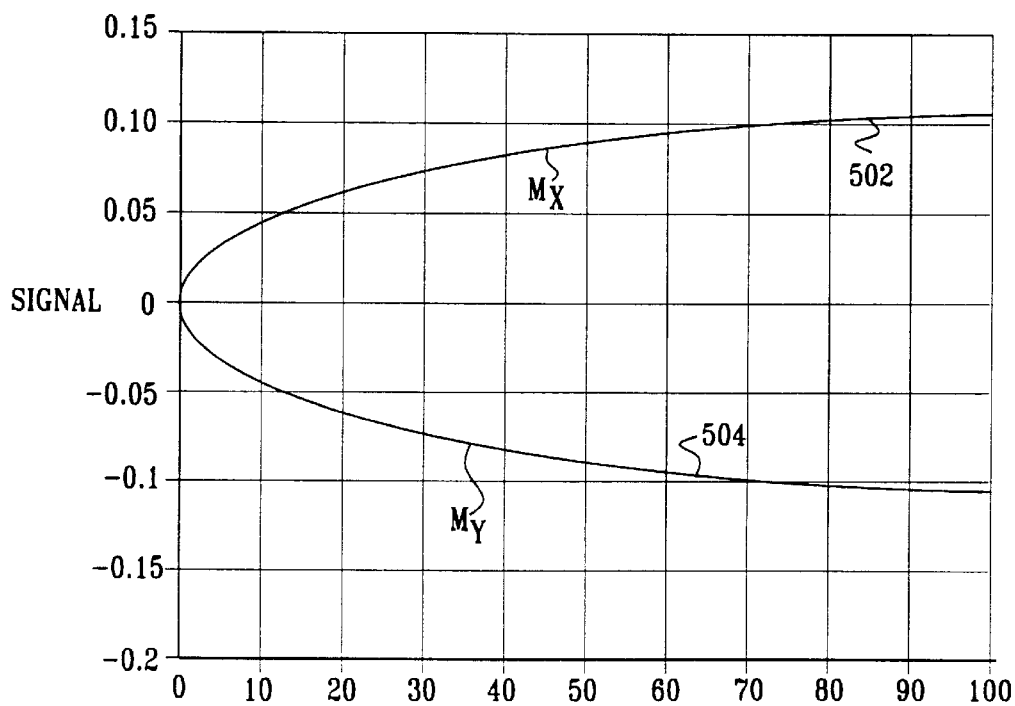
FIG. 6

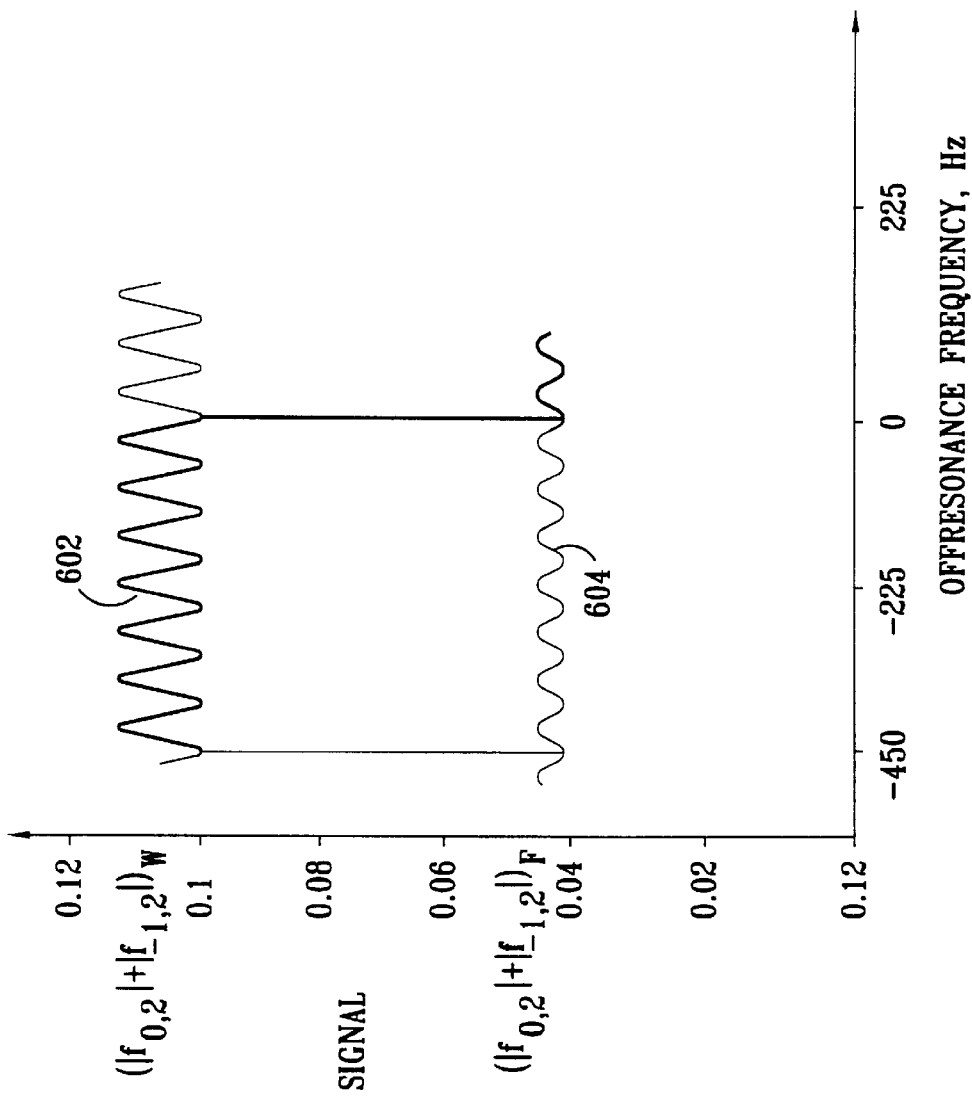

MAGNETIC RESONANCE IMAGING SYSTEM

BACKGROUND OF THE INVENTION

The present invention relates generally to magnetic resonance imaging systems, and specifically to systems using steady-state free precession techniques.

Magnetic resonance imaging (MRI) images nuclei having a magnetic moment, usually hydrogen nuclei, by measuring a signal generated by the nuclei precessing in a magnetic field. The angular frequency of precession $\omega_0$ is directly dependent on the magnetic field $B_0$ within which the nuclei are positioned, according to the Larmor equation:

$$\omega_0 = \gamma \cdot B_0 \quad (1)$$

wherein $\gamma$ is a constant termed the gyromagnetic ratio.

The magnetic field is set to vary in a known, spatially-dependent manner within the region being imaged, so that the corresponding precession frequency will vary in the same spatially-dependent manner. The spatially-dependent field is generated by imposing a plurality of magnetic fields having known gradients on the homogeneous "underlying" magnetic field $B_0$. Most preferably, three orthogonal, substantially linear gradients $G_x$, $G_y$, and $G_z$ are imposed, so that the magnetic field at any point (x, y, z) is given by the equation:

$$B(x,y,z) = B_0 + x \cdot G_x + y \cdot G_y + z \cdot G_z \quad (2)$$

In order to cause nuclei to precess, the nuclei are shifted from their equilibrium thermal state by a pulsed radio-frequency (RF) excitation field, whose magnetic component is in a direction orthogonal to the spatially-dependent magnetic field imposed on the nuclei, herein assumed to be along the z-axis. The frequency is approximately equal to the Larmor frequency, so that the RF pulse acts as a resonant driver of the nuclei. At the conclusion of the RF driving pulse, the nuclei will have been "flipped" towards the x-y plane, by an angle dependent on the length and amplitude of the RF pulse. The nuclei then relax towards their thermal equilibrium state, by precessing about the magnetic field, and thus generate a precession signal. The intensity of a specific frequency of precession signal will be a function of the numbers of nuclei precessing at that frequency, and thus the intensity gives a measure of the density of those nuclei at the position defined by the frequency.

Steady-state free precession (SSFP) is a technique for generating MRI signals which is well known in the MRI art, wherein the hydrogen nuclei do not completely return to their thermal equilibrium state. SSFP pulse sequences are described in *Magnetic Resonance Imaging* by Haacke et al., published by Wiley-Liss. The technique relies on achieving a quasi-steady-state of magnetization in a subject being scanned, usually a human subject, by applying an SSFP pulse sequence at repetition times (TR) significantly shorter than the spin-lattice (T1) and the spin—spin (T2) relaxation times of hydrogen nuclei within the subject. The SSFP pulse sequence comprises a series of RF excitation pulses. The SSFP sequence also comprises a plurality of magnetic gradient pulses which reverse the magnetic field gradients in a predetermined manner, in order to enhance the signal, by methods which are known in the art. Each set of pulses has the same overall repetition time TR. Using SSFP pulse sequences achieves high signal-to-noise ratios within short scan times. However, images produced by some SSFP sequences are very sensitive to motion.

An article titled "Motion-Insensitive, Steady-State Free Precession Imaging," by Zur et al., in *Magnetic Resonance in Medicine* 16 (1990), which is incorporated herein by reference, describes a method for overcoming problems associated with SSFP sequences caused by motion of the region being scanned. The method comprises generating the magnetic field gradients so that a time integral of each of the gradients during a TR period is substantially zero.

The method further comprises changing a phase of a transverse magnetization of the nuclei in a sequential manner, most preferably by changing a phase of the excitation pulses. For a series of N scan sequences, a phase shift of $$\frac{2\pi(j-1)}{N}$$

radians is added, as explained in appendix B, to the spins in each TR during the $j^{th}$ sequence (j=1, 2, ..., N). The signals from these scans are linearly combined to obtain a final image. The authors state that to avoid aliasing, it is necessary to use $N \geq 6$, and in order to reach steady-state it is necessary to wait T1 seconds between sequences. The authors further state that the SSFP signals are strongly dependent on the angle of precession, $\phi$, where $\phi$ is the total precession angle over one TR period.

In addition to determining the density of hydrogen nuclei at different sections of a region being imaged, the ability to differentiate between molecular species within which the hydrogen is a component is important. Methods for generating MRI scans which differentiate between species, such as water and fat, in an image are known in the art. For example, in an article titled "Linear Combination Steady-State Free Precession MRI" by Vasanawala et al., in *Magnetic Resonance in Medicine* 43 (2000), which is incorporated herein by reference, the authors describe a method for differentiating between water and fat by performing a series of SSFP scans. A first scan sequence is set to be a standard SSFP sequence, and generates raw data termed $D_{0\text{-}0}$. In a second scan sequence a phase of 180° is added to even numbered RF excitation pulses, generating raw data termed $D_{0\text{-}180}$. A water image is obtained from $D_{0\text{-}0} + i \cdot D_{0\text{-}180}$; a fat image is obtained from $D_{0\text{-}0} - i \cdot D_{0\text{-}180}$. Unfortunately, the separation of water from fat is affected both by the value of $$\frac{T1}{T2}$$

of the sample and by the RF flip angle. Furthermore, in this method, the value of TR is restricted to:

$$TR = \frac{1}{2\Delta_{WF}} \quad (3)$$

wherein $\Delta_{WF}$ is a difference between water and fat resonant frequencies, and the method is unable to determine water and fat content in a single voxel.

In general, in an imaging volume strong banding artifacts are generated if $\Delta\Phi$, the variation in precession angle $\Phi$ within the volume, is greater than about $\pi$ radians. Since $\Delta\Phi = 2\pi \cdot \neq f \cdot TR$, artifacts do not occur if:

$$TR < \frac{1}{2\Delta f} \quad (4)$$

wherein $\Delta f$ is the resonance frequency variation in the imaging volume.

While values of TR satisfying inequality (4) are possible at low fields, at higher fields, i.e., approximately 1.0 T and above, the required short TRs cause severe practical problems of implementation. The short TRs necessitate very short gradient switching times and very short image signal acquisition times. Thus, the known advantages of higher-field MRI are difficult to implement with short values of TR, which also has the effect of generating peripheral nerve stimulation and an increase in RF specific absorption rate (SAR).

Disadvantages of short TR include 1) High gradient demand. The maximum available in-plane resolution and slice width is very restricted. 2) Sub-optimal SNR per unit time, because the time allotted for data acquisition in each TR is short. 3) Efficient k-space acquisition strategies such as spiral and multi-shot EPI cannot be used. 4) Fat signal suppression is difficult. 5) SAR is high.

SUMMARY OF THE INVENTION

It is therefore desirable to provide apparatus and methods for generating magnetic resonance images without a restriction of repetition time.

In preferred embodiments of the present invention, a magnetic resonance imaging (MRI) system is implemented using radio-frequency (RF) and magnetic gradient pulses in a set of SSFP sequences. Each SSFP sequence comprises a short repetition time (TR) gradient echo with fully balanced gradients in the sequence. A set of MRI generating signals comprises two to five, most preferably two or three, SSFP sequences with RF excitation pulses having high flip angles. The repetition time for each sequence is not limited to short values. By applying specific signal acquisition and analysis techniques, described hereinbelow, and by using flip angles close to 90°, inaccuracies caused by not utilizing six or more SSFP sequences as a set of generating signals, as are used in the prior art, are significantly minimized for all tissues, and especially for tissues with short spin—spin relaxation times (T2). Image signal variation vs. precession angle is reduced enough so that short repetition times, as required by the prior art, are no longer required. Using flip angles close to 90° generates the added advantage, compared to methods used in the prior art, of providing a very high contrast when imaging fluid and soft tissue.

In preferred embodiments of the present invention, a set of N SSFP scans is acquired respectively from N sets of SSFP sequences. Most preferably, N=2. Alternatively, N is a whole number chosen from {3, 4, 5}. An incremental phase is added between scans of each set of sequences, as described in the Background of the Invention. A set of images, most preferably 2 images, is generated via a linear combination of the N acquired data sets. Preferably, the linear combination is formed from the "raw" data sets and is then reconstructed to form the images. Alternatively, the linear combination is formed after each data set has been reconstruction. The magnitudes of the images are added to provide a final image having a higher signal-to-noise level compared with the separate images.

In some preferred embodiments of the present invention, the RF pulse in the first sequence of each set of sequences is preceded by an RF pre-pulse, and immediately afterwards a de-phasing magnetic gradient pulse is applied to the system being imaged. The combination of RF pre-pulse and de-phasing gradient effectively zeroes the magnetization of the system prior to the subsequent RF pulse. The system approaches a steady state in a substantially smooth manner, enabling measurements made on the system to be utilized from the initial RF pulses.

There is therefore provided, according to a preferred embodiment of the present invention, a method for magnetic resonance imaging (MRI), including:

imposing N sets of steady-state free precession (SSFP) sequences on an object to be imaged, the sequences comprising respective initial radio-frequency (RF) excitation pulses, each initial RF excitation pulse having a predetermined phase shift relative to the other initial RF excitation pulses, wherein N is a value chosen from a set of whole numbers larger than one and less than six;

setting the phase shift of the RF pulse of the sequences so that the phase shift of the RF pulse of an $M^{th}$ sequence is substantially equal to $$\frac{2\pi(M-1)}{N}$$

radians, wherein M is a value chosen from a set of whole numbers larger than 0 and less than or equal to N;

receiving a respective set of image signals from the object responsive to the N sets of SSFP sequences; and processing the set of received image signals so as to generate an image of the object.

Preferably, processing the set of received image signals includes:

combining the image signals to form a first linear combination and a second linear combination thereof; and generating the image by averaging a first magnitude of the first linear combination and a second magnitude of the second linear combination.

Further preferably, processing the set of received image signals includes performing a Fourier transform on each of the image signals, and combining the image signals includes combining the Fourier transforms.

Preferably, at least some of the image signals are dependent on an angle of precession $\Phi$, and the image of the object is substantially independent of $\Phi$, so that substantially no banding artifacts occur in the image.

Alternatively or additionally, the object includes includes a region having a resonant frequency varying by a factor $\Delta f$, and a repetition time (TR) of each sequence of the N sets of SSFP sequences includes a time greater than a reciprocal of $2\Delta f$.

Preferably, each of the RF excitation pulses generates a flip angle greater than about 70°.

Preferably, the object includes body fluids and soft tissues, and the image of the object includes respective regions corresponding to the body fluids and the soft tissues having high contrast between the regions.

Further preferably, the first SSFP sequence in each of the N sets of sequences is preceded by a de-phasing magnetic gradient and an RF pre-pulse which generates a flip angle substantially equal to 90°.

Preferably, the object includes water and fat, and the method includes:

setting a frequency of a frequency synthesizer generating the N sets of SSFP sequences to be substantially equal to an average of a water resonance frequency $v_W$ and a fat resonance frequency $v_F$;

setting a repetition time (TR) of each of the sequences to be substantially equal to a first odd integral of a time period $\tau$, wherein $$\tau = \frac{1}{2(v_F - v_W)};$$

wherein receiving the respective set of image signals includes:
receiving a first set of image signals at a first readout time substantially equal to a second odd integral of the time period τ and less than the first odd integral;
receiving a second set of image signals at a second readout time substantially equal to the second odd integral incremented by τ;
wherein processing the set of received image signals includes:
processing the first and the second set of image signals to form respective processed first and second signals; and
generating a water image and a fat image responsive to the first processed signals and the second processed signals.

There is further provided, according to a preferred embodiment of the present invention, apparatus for magnetic resonance imaging (MRI), including:
a magnetic field generator which is adapted to impose N sets of steady-state free precession (SSFP) sequences on an object to be imaged, the sequences comprising respective initial radio-frequency (RF) excitation pulses, each initial RF excitation pulse having a predetermined phase shift relative to the other initial RF excitation pulses, wherein N is a value chosen from a set of whole numbers larger than one and less than six, and wherein the phase shift of the RF pulse of an $M^{th}$ sequence is substantially equal to $$\frac{2\pi(M-1)}{N}$$

radians, wherein M is chosen from a set of whole numbers larger than 0 and less than or equal to N; and
a signal processor which is adapted to receive a respective set of image signals from the object responsive to the N sets of SSFP sequences, and to process the set of received image signals so as to generate an image of the object.

Preferably, the signal processor is adapted to:
combine the image signals to form a first linear combination and a second linear combination thereof; and
generate the image by averaging a first magnitude of the first linear combination and a second magnitude of the second linear combination.

Further preferably, the signal processor is adapted to perform a Fourier transform on each of the image signals and to combine the Fourier transforms.

Preferably, at least some of the image signals are dependent on an angle of precession Φ, and the image of the object is substantially independent of Φ, so that substantially no banding artifacts occur in the image.

Alternatively or additionally, the object includes a region varying in resonant frequency by a factor Δf, and a repetition time (TR) of each sequence of the N sets of SSFP sequences includes a time greater than a reciprocal of 2Δf.

Preferably, each of the RF excitation pulses generates a flip angle greater than about 70°.

Preferably, the object includes body fluids and soft tissues, and the image of the object includes respective regions corresponding to the body fluids and the soft tissues having high contrast between the regions.

Preferably, the first SSFP sequence in each of the N sets of sequences is preceded by a de-phasing magnetic gradient and an RF pre-pulse which generates a flip angle substantially equal to 90°.

Preferably, the object includes water and fat, and the magnetic field generator is adapted to:
set a frequency of a frequency synthesizer generating the N sets of SSFP sequences to be substantially equal to an average of a water resonance frequency $\nu_W$ and a fat resonance frequency $\nu_F$;
set a repetition time (TR) of each of the sequences to be substantially equal to a first odd integral of a time period τ, wherein $$\tau = \frac{1}{2(\nu_F - \nu_W)};$$

and the signal processor is adapted to:
receive a first set of image signals at a first readout time substantially equal to a second odd integral of the time period τ and less than the first odd integral;
receive a second set of image signals at a second readout time substantially equal to the second odd integral incremented by τ;
process the first and the second set of image signals to form respective processed first and second signals; and
generate a water image and a fat image responsive to the first processed signals and the second processed signals.

The present invention will be more fully understood from the following detailed description of the preferred embodiments thereof, taken together with the drawings, in which:

BRIEF DESCRIPTION OF THE DRAWINGS

FIG. 5 is a graph illustrating results generated by the process of analysis described with respect to FIG. 4, according to a preferred embodiment of the present invention;

FIG. 6 is a graph illustrating the approach of the magnetization of an object to a steady-state when an RF pre-pulse and a de-phasing magnetic gradient are applied to the system of FIG. 1, according to a preferred embodiment of the present invention;

FIG. 9 is a graph illustrating the separation of water and fat using the process described with reference to FIGS. 7 and 8, according to a preferred embodiment of the present invention.

DETAILED DESCRIPTION OF PREFERRED EMBODIMENTS

Figure 1:
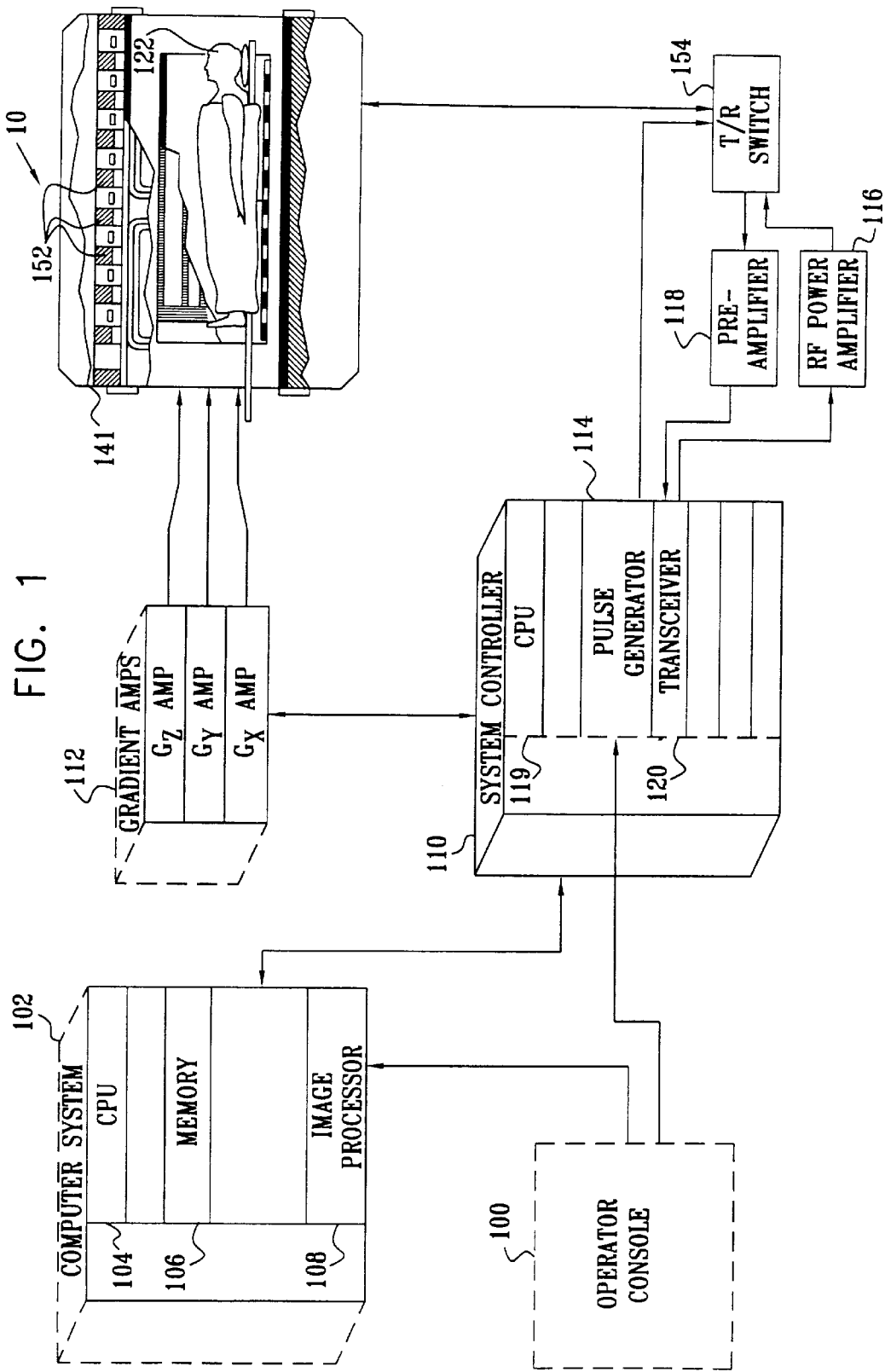
FIG. 1 is a schematic block diagram of a magnetic resonance imaging (MRI) system, according to a preferred embodiment of the present invention.

Reference is now made to FIG. 1, which is a schematic block diagram of a magnetic resonance imaging (MRI)

system 10, according to a preferred embodiment of the present invention. System 10 most preferably comprises an industry-standard MRI system, such as the Signa system produced by General Electric Company of Schenectady, N.Y. System 10 acts, inter alia, as a magnetic field generator and as a signal processor. In system 10, an operator console 100 is used to operate a computer system 102, which comprises a central processing unit (CPU) 104 and one or more memories 106. Memories 106 preferably comprise one or more non-volatile memory devices, such as a magnetic tape drive and/or a computer hard drive, which are used to store image data acquired. An image processor 108 in system 102 comprises devices, known in the art, which allow operator console 100 to provide an interactive image display.

System 102 controls the operation of MRI system 10 via a system controller 110 and a gradient amplifier system 112. Preferably, controller 110 comprises a CPU 119 which is used together with CPU 104 to operate controller 110. Controller 110 comprises a pulse generator 114, which, via overall control instructions received from system 102, generates pulses and waveforms necessary to drive amplifiers comprised in system 112. The amplifiers generate currents which in turn generate respective magnetic gradients $G_x$, $G_y$, and $G_z$ in a patient magnet assembly 141, by methods known in the art. The pulse generator also generates signals used to drive a radio-frequency (RF) power amplifier 116, which outputs RF power signals used to power whole-body RF coils 152 comprised in patient magnet assembly 141. As described in more detail below, a phase of the RF signal input to coils 152 is varied in a predetermined manner. Coils 152 may also be used as MRI signal detector coils, or alternatively coils 152 are divided into separate transmit and receive coils, as explained in more detail with respect to FIG. 2 below.

When coils 152 are not separate, a transmit/receive switch 154, controlled by generator 114, ensures that there is no cross-talk between transmission of the power RF signals to coils 152 and the "raw" MRI signals generated therein. The MRI signals are transferred via switch 154 and a low noise pre-amplifier 118 to a transceiver 120, which together with CPU 119 and system 102 acts as signal processor. An explanation of functions of transceiver 120, and of related components, is given below with reference to FIG. 2. Controller 110 comprises other components not shown for clarity, such as power supplies and memories, which are necessary for the controller to function as a driver for amplifier system 112, and so as to transmit RF pulses and receive MRI signals.

Figure 2:
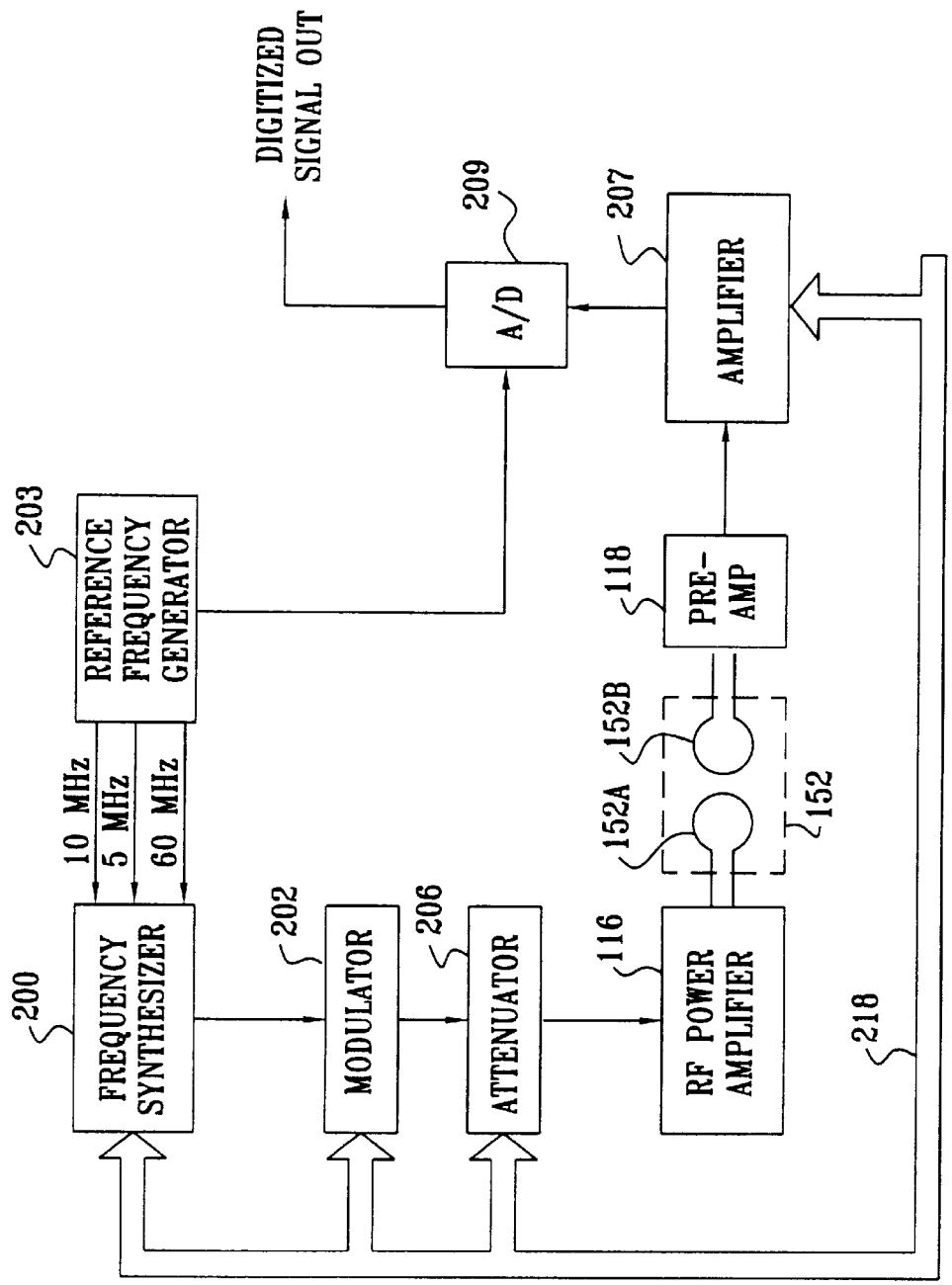
FIG. 2 is a schematic block diagram illustrating functions performed by a transceiver in the system of FIG. 1, according to a preferred embodiment of the present invention.

FIG. 2 is a schematic block diagram illustrating functions performed by transceiver 120, according to a preferred embodiment of the present invention. It will be understood that some of the functions described herein with respect to transceiver 120 may be performed by other components of controller 110, such as generator 114. A reference frequency generator 203 preferably supplies substantially fixed known frequencies of 5 MHz, 10 MHz, and 60 MHz to a frequency synthesizer 200. Synthesizer 200 uses the reference frequencies to generate reference RF pulse signals, for coils 152, at a frequency and a phase determined by control inputs to the synthesizer, the control inputs being determined by system 102. The reference signals are fed through a modulator 202 and an attenuator 206, which together form an envelope for an input RF pulse to amplifier 116 (FIG. 1). Thus, an RF power excitation pulse having a predetermined shape, phase, and frequency is delivered to coil 152. Modulator 202 and attenuator 206 are preferably controlled by inputs from system 102, typically via a bus 218. Optionally, coil 152 comprises a transmit coil 152A and a separate receive coil 152B, the transmit coil being driven by amplifier 116. As described in more detail below, each RF power pulse and the signals generated by magnet gradient amplifier system 112 are produced with a substantially constant repetition time (TR), and together comprise a sequence of signals generating steady-state free precession (SSFP) signals.

MRI signals produced by a subject 122 (FIG. 1) are detected by coil 152, or optionally by receive coil 152B, and are fed to low-noise preamplifier 118, and from there to an amplifier 207. Amplifier 207 receives control signals from system 102, and is preferably set to be active during a predetermined time interval within the overall period TR. The amplified signals, with their phases preserved, are preferably digitized in an A/D digitizer 209, and the digitized results are transferred to controller 110 for further processing. Alternatively, signals from preamplifier 118 are amplified, maintaining phase relations, and are then digitized according to other methods known in the MRI art.

Figure 3:
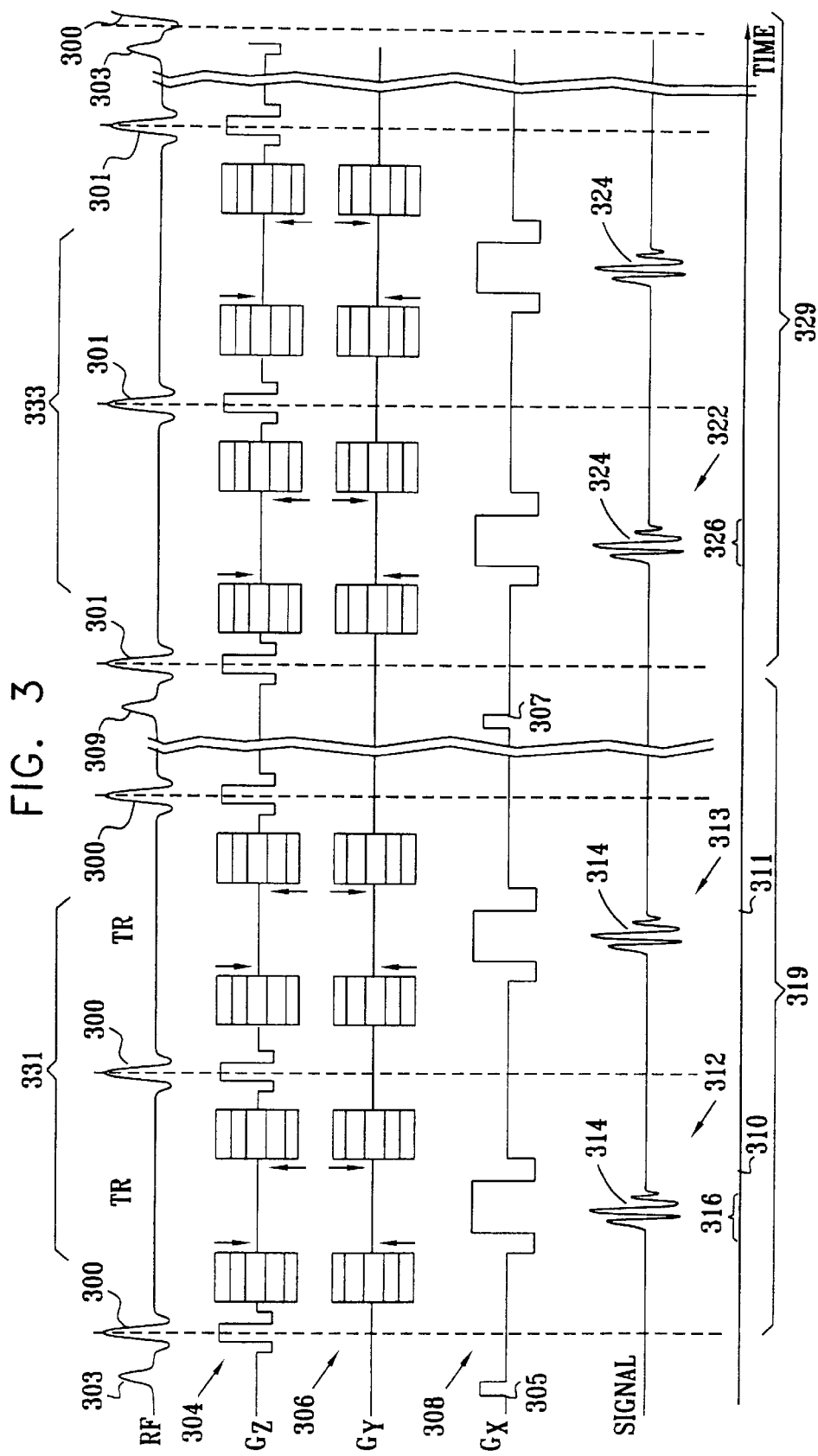
FIG. 3 is a set of schematic graphs representing signals generated within the system of FIG. 1, according to a preferred embodiment of the present invention.

FIG. 3 is a set of schematic graphs representing waveforms and signals generated within system 10, according to a preferred embodiment of the present invention. During a first time interval 310, of duration TR, a first sequence 312 is imposed on subject 122, the sequence being initiated by an RF pulse 300. Parameters of RF pulse 300, such as an amplitude, a duration, and a pulse shape, are preferably set by system 10. In addition to pulse 300, sequence 312 comprises magnetic gradient waveforms $G_z$, $G_y$, and $G_x$, shown in FIG. 3 as waveforms 304, 306, and 308 respectively. Gradient waveforms 304 and 306 are varied in a phase-encoding manner, waveform 304 acting as a slice select, as is known in the art. Most preferably, an area of each gradient waveform $G_z$, $G_y$, and $G_x$, measured over time interval 310, is substantially equal to zero. Gradient waveform 308 is used as a readout gradient, so that an output signal 314 is acquired at a time defined by waveform 308, substantially during a time interval 316 at a "center" of waveform 308.

A next sequence 313 in a time interval 311 is substantially similar to sequence 312 except for phase encoding. Sequences similar to 312 and 313 are repeated M times over a time period 319 with phase encoding gradient changes, and during each sequence signal 314 is acquired. The number of times, M, is preferably selected, as is known in the art, depending on the resolution and/or signal-to-noise desired in the final image. Typically, M is in a range of 128–256. The set of M repetitions comprises a first set 331 of sequences. Set 331 is repeated N times, where N≦5, and N is the number of scan sequences. As described in the Background of the Invention, a phase shift of $$\frac{2\pi(j-1)}{N}$$

radians is added during scan j, where j=1, 2, ..., N. At the end of M repetitions of first sequences 312, 313, a time interval 329 for a second set of scans begins.

During time interval 329, a second set 333 of M sequences 322 is imposed on subject 122. Each sequence of set 333 is initiated by an RF pulse 301. The gradient waveforms of each sequence 322 are generally the same in amplitude, phase and frequency as those of sequence 312, comprising substantially the same phase encoding gradients, except for a phase $\phi$ of $$\frac{2\pi}{N}$$

radians added to the spins during each TR. An output image signal 324 is acquired over a time interval 326, which corresponds to interval 316 of set 312. For example, in the case described below where N=2, $\phi$=0 and $\pi$.

Image signals 314 and 324 are received from coil 152, or coil 152B, and are amplified and digitized, as described above with reference to FIGS. 1 and 2. It will be appreciated that sets of image signals corresponding to image signals 314 and 324 are generated during the phase encoding of the magnetic gradients. These sets of "raw" data image signals are used to generate an image of subject 122.

As described in more detail in the above referenced article titled "Motion-Insensitive, Steady-State Free Precession Imaging," image signal 314 may be considered to be a Fourier series of the form:

$$S = \sum_{k=-\infty}^{\infty} f_k = \sum_{k=-\infty}^{\infty} A_k e^{ik\Phi} \tag{5}$$

wherein S is image signal 314, and $f_k$ are terms of the series, and each term $A_k$ is assumed to be independent of $\Phi$.

Equation (5) is correct when N, the number of scans, is infinite.

The article describes how to isolate $f_k$ when N is finite, by running N SSFP sets of sequences, so that a phase shift of $$\phi_m = \frac{2\pi(m-1)}{N}$$

radians is added to the spins of the $m^{th}$ sequence (m=1, 2, . . . , N).

Theoretically, $f_k$ is determined by performing a Fourier transform:

$$f_k = \frac{1}{N}\sum_{m=0}^{\infty} I_m e^{-i\frac{2\pi}{N}mk} \text{ where } N \to \infty \text{ and } -\infty < k < \infty \tag{6}$$

where $I_m$ is the image acquired during scan m. For finite N:

$$f_{k,N} = \frac{1}{N}\sum_{m=0}^{N-1} I_m e^{-i\frac{2\pi}{N}mk} \tag{7}$$

where $$k = -\frac{N}{2} \text{ to } \frac{N}{2} - 1$$

for even N, $$k = -\frac{N}{2} + \frac{1}{2} \text{ to } \frac{N}{2} - \frac{1}{2}$$

for odd N.

Thus, for N=2, where k=-1 and 0, $$f_{0,2} = \frac{1}{2}(I_0 + I_1) \text{ and} \tag{8}$$

$$f_{-1,2} = \frac{1}{2}(I_0 + I_1 e^{i\pi}) = \frac{1}{2}(I_0 - I_1) \tag{9}$$

wherein $f_{0,2}$, $f_{-1,2}$ correspond to approximations of Fourier components of $f_0$ and $f_{-1}$.

Similarly, for N=3:

$$f_{0,3} = \frac{1}{3}(I_0 + I_1 + I_2) \text{ and} \tag{10}$$

$$f_{-1,3} = \frac{1}{3}\left(I_0 + I_1 e^{i\frac{2\pi}{3}} + I_2 e^{i\frac{4\pi}{3}}\right) \tag{11}$$

The approximation of $f_{k,N}$, in equation (7) for $f_k$ in equation (6) is a good approximation, as explained hereinbelow with reference to FIG. 6.

Figure 4:
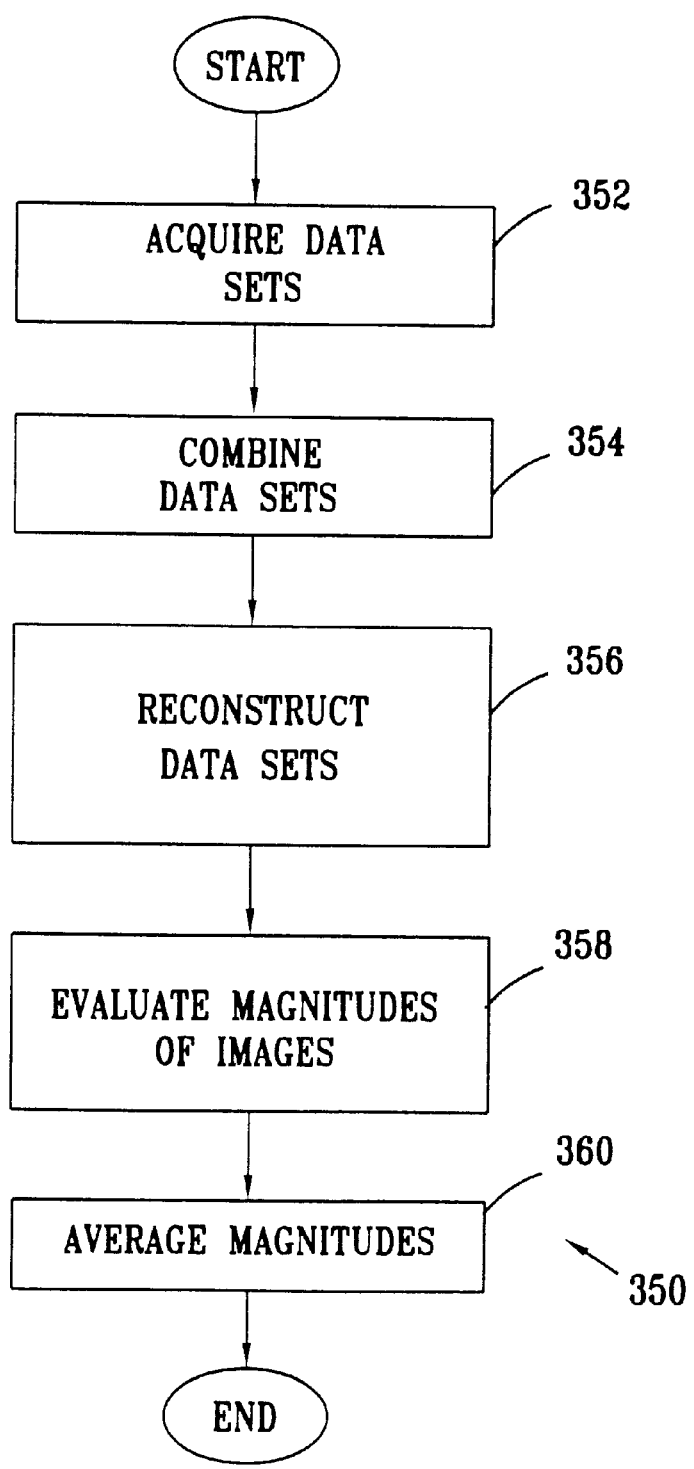
FIG. 4 is a flowchart showing steps involved in an analysis process of image signals produced in the system of FIG. 1, according to a preferred embodiment of the present invention.

FIG. 4 is a flowchart showing steps involved in an analysis process 350 of signals 314 and 324, according to a preferred embodiment of the present invention. Process 350 utilizes the analysis shown for deriving data sets $f_{k,N}$. In a first step 352, signals are acquired and stored as described above with reference to FIGS. 1, 2, and 3. In a second step 354, acquired data sets $I_m$, corresponding to signals 314 and 324, are combined to generate data sets $f_{k,N}$, as in equation (7) where k=0 and -1. In a third step 356, $f_{-1,N}$ and $f_{0,N}$ are reconstructed to generate images. Alternatively, the second and third steps can be interchanged. In a fourth step 358, magnitude images $|f_{0,N}|$ and $|f_{-1,N}|$ are determined, and in a final step 360 $|f_{0,N}|$ and $|f_{-1,N}|$ are averaged in order to derive a final image. Since noise in $|f_{0,N}|$ and $|f_{-1,N}|$ is not correlated, the signal-to-noise ratio of the final image, compared to $|f_{0,N}|$ or $|f_{-1,N}|$, is improved by a factor approximately equal to 1.4.

FIG. 5 is a graph illustrating results generated by the process of analysis described above with respect to FIG. 4 and for N=2, according to a preferred embodiment of the present invention. The graphs are derived for blood, wherein T1=1000 ms and T2=250 ms. TR was set at 10 ms, and the flip angle=90°. A graph 402 shows results for one unprocessed signal vs. precession angle $\phi$. Graphs 404 and 406 show values of $|f_{0,2}|$ and $|f_{-1,2}|$ vs. precession angle $\phi$ respectively. As is demonstrated in the graph, variation of values of $|f_{0,2}|$ and $|f_{-1,2}|$ with respect to $\phi$ is substantially eliminated, showing that the approximations of equations (9) and (10) are valid. A graph 408 shows values of $f_0$ and $f_{-1}$. Comparing graph 408 with graphs 404 and 406 illustrates the closeness of $f_0$ to $f_{0,2}$ and $f_{-1}$ to $f_{-1,2}$.

For soft tissues, wherein values of T2 are less than 250 ms, the variations of signal level are significantly less than the small variations shown in the graph. Using flip angles of the order of 90°, as in the example illustrated by the graph, is beneficial since the highest contrast between body fluids, such as blood or bile, and soft tissues such as gray or white matter, is achieved for flip angles equal to 90°. From inspection of the graph, it will be appreciated that signal intensity is approximately independent of $\Phi$. Thus prior art restrictions on TR, as exemplified in inequality (4), do not apply to preferred embodiments of the present invention, so that in such preferred embodiments large values of TR can be implemented with substantially no banding artifacts in the final image.

In alternative preferred embodiments of the present invention, N sequence scans of SSFP signals, wherein N comprises a value 3, 4, or 5, are imposed on subject 122.

Apart from the differences described hereinbelow, each of the N scans of signals are generally similar in form to the set of 2 SSFP signals described above with reference to FIG. 3. A phase shift of $$\phi_m = \frac{2\pi(m-1)}{N}$$

radians is added to the $m^{th}$ scan, where m=1, 2, ..., N. The phase shift is added to the spins, as described in the above-referenced article by Zur et al. Image signals produced by the N sequence scans of SSFP signals are analyzed substantially as described above with reference to FIG. 4. Thus, each of the sets of 1, ..., N image signals are combined linearly as in equation (8) to generate $f_{0,N}$ and $f_{-1,N}$ for the averaged image signal. The magnitudes $|f_{0,N}|$ and $|f_{-1,N}|$ are determined, and the magnitudes are averaged to generate a final image.

For example, when N=3, a phase of 0

$$\frac{2\pi}{3},$$

and $$\frac{4\pi}{3}$$

radians is added in each TR during the first, second, and third (last) sets of scans respectively. In this case, as stated above, $$f_{0,3} = \frac{1}{3}(I_0 + I_1 + I_2) \text{ and} \tag{10}$$

$$f_{-1,3} = \frac{1}{3}\left(I_0 + I_1 e^{i\frac{2\pi}{3}} + I_2 e^{i\frac{4\pi}{3}}\right) \tag{11}$$

FIG. 5 illustrated results obtained using a flip angle of 90°. If it is desired to use a lower flip angle, it may be preferable to use more than two sets of SSFP sequences, for example, N=3. Using two or more sets of SSFP sequences does not necessarily increase the total scan time compared to a single SSFP scan, since more efficient signal acquisition methods can be used. For example, for a single sequence, wherein TR=3.3 ms, to acquire 200 k-space lines requires a total scan time of 660 ms. A typical acquisition window in this case is 1 ms. If N is set at 2, and TR is lengthened to 10 ms, then the acquisition window can be set to 8 ms. If 6 k-space lines are acquired per sequence, using echo planar imaging (EPI) for example, then in a total scan time of 660 ms 198 lines are acquired. It will be appreciated that the longer data sampling window, using TR=10 ms, gives a higher signal-to-noise level. In the N=2 scan 80% of the scan time is used for data sampling, compared to 30% for the single scan when TR=3.3 ms.

Referring back to FIG. 3, it is known in the art that magnetization oscillations occur after RF excitation pulses such as RF pulse 300 have been applied. The oscillations are a function of Φ. In some preferred embodiments of the present invention, the first RF pulse 300 in the set of SSFP sequences 312 is preceded by a 90° non-selective RF pre-pulse 303 and a de-phasing gradient 305. Pre-pulse 303 and gradient 305 effectively zero the magnetization of subject 122 before excitation by pulse 300, and an approach to a steady-state of magnetization is substantially smooth for subsequent RF pulses 300. Preferably, a pre-pulse 309 and a de-phasing gradient 307 is also applied before the first RF pulse 301 of set 322. 24

FIG. 6 is a graph illustrating the approach of the magnetization of an object to a steady-state when pre-pulse 303 and gradient 305 are applied, according to a preferred embodiment of the present invention. Graphs 502 and 504 show simulated values of magnetization components Mx and My vs. RF pulse number respectively, for an object initially having substantially zero magnetization, wherein T1=1000 ms, T2=250 ms, flip angle=90°, and precession angle φ=90°. The approach to steady-state is smooth. The simulation applies to the acquired data sets as described in the first step of FIG. 4, so that data acquisition can start from the earliest RF pulses.

Figure 7:
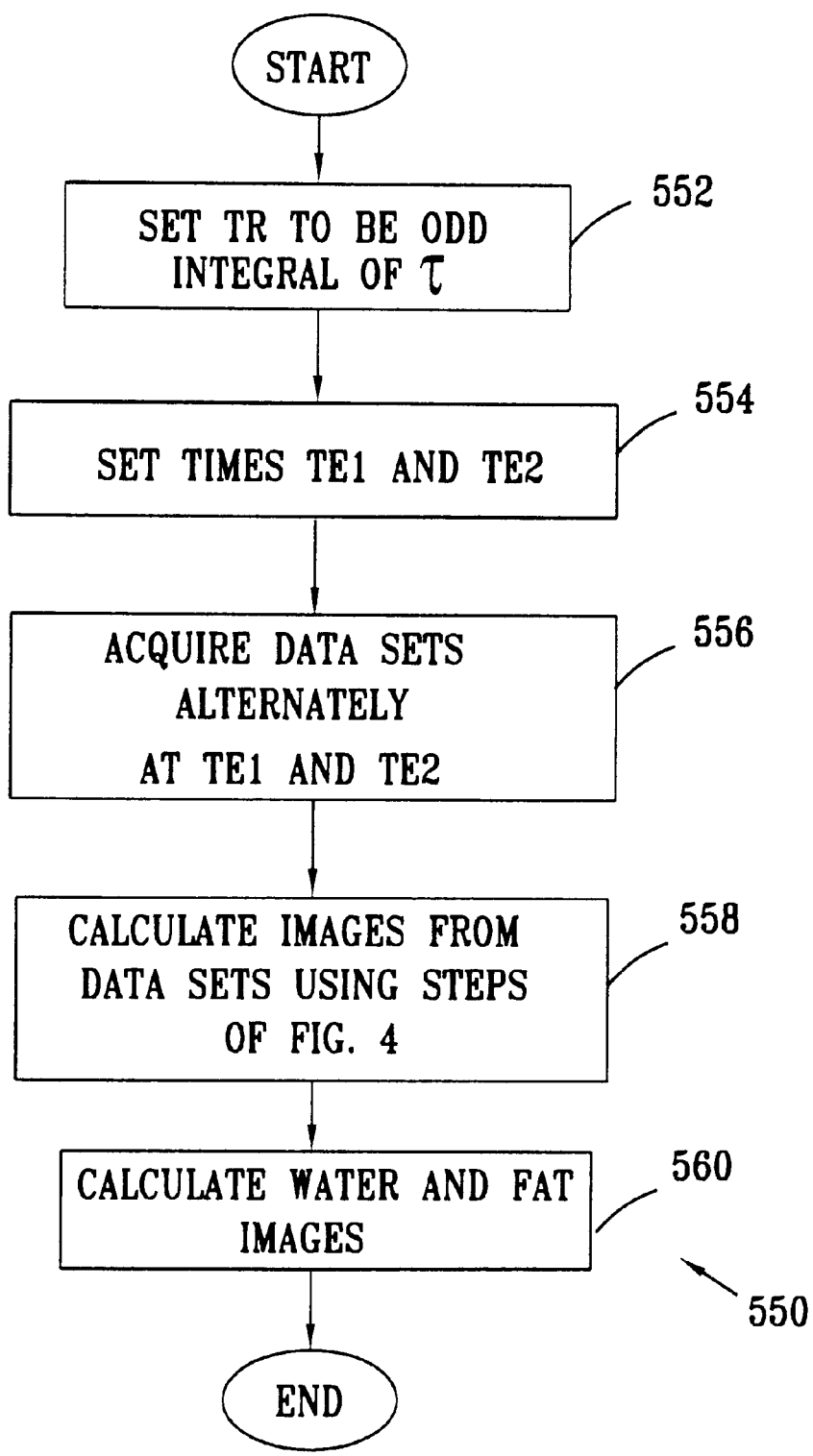
FIG. 7 is a flowchart showing steps followed in an MRI scan wherein water and fat images are separated, according to a preferred embodiment of the present invention.
Figure 8:
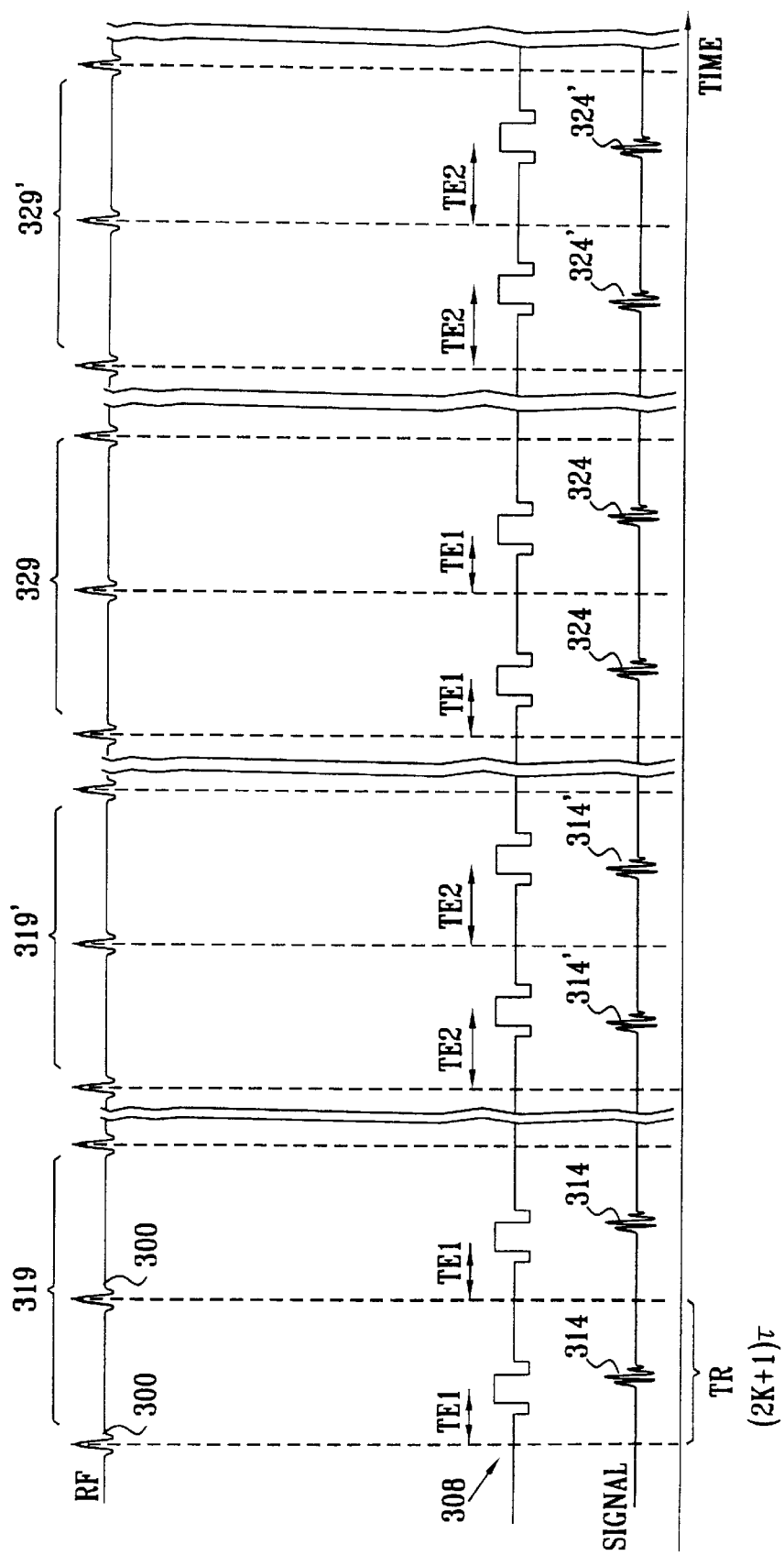
FIG. 8 is a set of graphs showing timing values for the scan of FIG. 7, according to a preferred embodiment of the present invention.

FIG. 7 is a flowchart showing steps followed in an MRI scan wherein water and fat images are separated, and FIG. 8 is a set of graphs showing timing values for the scan of FIG. 7, according to a preferred embodiment of the present invention. FIG. 8 is based on FIG. 3, and except for the differences described hereinbelow, graphs and elements of the graphs in FIG. 8 having the same numerals as graphs and elements of the graphs in FIG. 3 correspond to substantially the same signals and elements of the signals. In FIG. 8, graphs 304 and 306 (FIG. 3) have been omitted for clarity. Scans taken during time interval 319 are repeated during a time interval 319'; similarly, scans taken during time interval 329 are repeated during a time interval 329'. Scans during time intervals 319' and 329' are substantially similar to respective scans during time intervals 319 and 329, except for a difference in the readout times TE1 and TE2 between the primed and non-primed scans, as described below.

Referring to FIG. 7, in an initial step 552 of a process 550, a frequency v generated by synthesizer 200 is set to be approximately at the water resonance frequency $v_W$. A value τ, given by the following equation:

$$\tau = \frac{1}{2 \cdot \Delta_{WF}} \tag{12}$$

wherein $\Delta_{WF} = v_F - v_W$
gives the time after which the water and fat spins have a phase difference of π radians.

A value of repetition time TR for all scans is set to be an odd integral value of τ, i.e., $$TR = (2k+1)\tau \tag{13}$$

wherein k is a whole number.

In steps 554 and 556, during a first set of scans in time interval 319, the echo time (graph 308) is set to be substantially equal to a value TE1, given by:

$$TE1 = (2m+1)\tau \tag{14}$$

wherein m is a whole number smaller than k.

During a second set of scans in time interval 319', the echo time is set to be substantially equal to a value TE2, given by:

$$TE2 = TE1 + \tau \tag{15}$$

The alternation of echo times is repeated for subsequent scans, so that scans in time interval 329 have echo times of TE1, and scans in time interval 329' have echo times of TE2.

In a step 558, the analysis described above with reference to FIG. 4 is performed on sets of data with readout TE1, corresponding to signals 314 and 324, generating pixel values herein termed S1, and on sets of data with readout TE2, corresponding to signals 314' and 324', generating pixel values herein termed S2. For any specific pixel, if W represents a fraction of water, and F represents a fraction of fat within a voxel:

$$S_1 = (W+F) \cdot e^{i\psi_1} \quad (16a)$$

and $$S_2 = (W-F) \cdot e^{i\psi_2} \quad (16b)$$

wherein $\psi_1$ and $\psi_2$ represent phase shifts, at TE1 and TE2 respectively, due to field inhomogeneity and/or chemical shift.

Rewriting equations (16a) and (16b) gives $$S'_1 = W + F \quad (17a)$$

and $$S'_2 = (W-F) \cdot e^{i\psi} \quad (17b)$$

wherein $\psi = \psi_2 - \psi_1$ represents the phase shift due to field inhomogeneity and/or chemical shift during time $\tau$.

Since synthesizer 200 has been set to generate the scan frequency to be substantially between the resonance frequencies of water and fat, $-\pi \leq \psi \leq 0$ for water, and $0 \leq \psi \leq \pi$ for fat. Rearranging equations (17a) and (17b) gives $$W = S'_1 - S'_2 e^{-i\psi} \cdot \text{sign}(\psi - \psi_0) \quad (18a)$$

and $$F = S'_1 + S'_2 e^{-i\psi} \cdot \text{sign}(\psi - \psi_0) \quad (18b)$$

wherein $\psi_0$ is a constant phase defined by the equation:

$$\psi_0 = 2\pi\tau\nu_0 \quad (19)$$

where $\nu_0$ is the difference in frequency between the synthesizer frequency $\nu$ and the mid-frequency of the water and fat resonances.

In equations (18a) and (18b)

$$\text{sign}(\psi - \psi_0) = -1 \text{ when } (\psi - \psi_0) < 0,$$
$$\text{sign}(\psi - \psi_0) = 0 \text{ when } (\psi - \psi_0) = 0, \text{ and}$$
$$\text{sign}(\psi - \psi_0) = 1 \text{ when } (\psi - \psi_0) > 0.$$

In a final step 560, the analysis described in equations 16a to 19 is applied to the values of S1 and S2 generated in the scans represented in FIG. 8, in order to generate separate water and fat images.

FIG. 9 is a graph illustrating the separation of water and fat using the process described above with reference to FIGS. 7 and 8, according to a preferred embodiment of the present invention. Graphs 602 and 604 show simulated values of signal strength, $(|f_{0,2}|+|f_{-1,2}|)W$ and $(|f_{0,2}|+|f_{-1,2}|)F$, for water and fat respectively, vs. off-resonance frequency $\Delta f$ due to field inhomogeneity. The graphs simulate results for a field strength of 3T, giving a value for $\Delta_{WF}$ of 450 Hz, and a value of $\tau$ of 1.1 ms. TR=$7\tau$=7.7 ms, TE1=$3\tau$=3.3 ms, TE2=$4\tau$=4.4 ms. In the simulation the flip angle is set to be 70°, W=0.7, and F=0.3. The synthesizer frequency is set midway between the water and fat resonances. The graphs show that in the region $-450 < \Delta f < 0$ the water and fat images are well separated, and the ratios of the mean signal values, 0.105 and 0.045, correspond to the ratio $$\frac{W}{F}.$$

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Apparatus for magnetic resonance imaging (MRI), comprising:

a magnetic field generator which is adapted to impose N sets of steady-state free precession (SSFP) sequences on an object to be imaged, the sequences comprising respective initial radio-frequency (RF) excitation pulses, each initial RF excitation pulse having a predetermined phase shift relative to the other initial RF excitation pulses, wherein N is a value chosen front a set of whole numbers larger than one and less than six, and wherein the phase shift of the RF pulse of an $M^{th}$ sequence is substantially equal to $$\frac{2\pi(M-1)}{N}$$

radians, wherein M is chosen from a set of whole numbers larger than 0 and less than or equal to N;

a signal processor which is adapted to receive a respective set of image signals from the object responsive to the N sets of SSFP sequences, and to process the set of received image signals so as to generate an image of the object; and wherein the object comprises a region varying in resonant frequency by a factor $\Delta f$, and wherein a repetition time (TR) of each sequence of the N sets of SSFP sequences comprises a time greater than a reciprocal of $2\Delta f$.

2. Apparatus according to claim 1, wherein the signal processor is adapted to:

combine the image signals to form a flint linear combination and a second linear combination thereof; and generate the image by averaging a first magnitude of the first linear combination and a second magnitude of the second linear combination.

3. Apparatus according to claim 2, wherein the signal processor is adapted to perform a Fourier transform on each of the image signals and to combine the Fourier transforms.

4. Apparatus according to claim wherein at least some of the image signals are dependent on an angle of precession $\Phi$, and wherein the image of the object is substantially independent of $\Phi$, so that substantially no banding artifacts occur in the image.

5. Apparatus according to claim 1, wherein each of die RF excitation pulses generates a flip angle greater than about 70°.

6. Apparatus according to claim 1, wherein the object comprises body fluids and soft tissues, and wherein the image of the object comprises respective regions corresponding to the body fluids and the soft tissues having high contrast between the regions.

7. Apparatus for magnetic resonance imaging (MRI), comprising:

a magnetic field generator which is adapted to impose N sets of steady-state free precession (SSFP) sequences on an object to be Imaged, the sequences comprising respective initial radio-frequency (RF) excitation pulses, each initial RF excitation pulse having a predetermined phase shift relative to the other initial RF excitation pulses, wherein N is a value chosen from a set of whole numbers larger than one and less than six, and wherein the phase shift of the RF pulse of an $M^{th}$ sequence is substantially equal to $$\frac{2\pi(M-1)}{N}$$

radians, wherein M is chosen from a set of whole numbers larger than 0 and less than or equal to N, a signal processor which is adapted to receive a respective set of image signals from the object responsive to the N sets of SSFP sequences, and to process the set of received image signals so as to generate an image of the object; and wherein the first SSFP sequence in each of the N sets of sequences is preceded by a de-phasing magnetic gradient and an RE pre-pulse which generates a flip angle substantially equal to 90°.

8. Apparatus according to claim 7, wherein the signal processor is adapted to:

combine the image signals to form a first linear combination and a second linear combination thereof; and generate the image by averaging a first magnitude of the first linear combination and a second magnitude of the second linear combination.

9. Apparatus according to claim 8, wherein the signal processor is adapted to perform a Fourier transform on each of the image signals and to combine the Fourier transforms.

10. Apparatus according to claim 7, wherein at least some of the image signals are dependent on an angle of precession Φ, and wherein the image of the object is substantially independent of Φ, so that substantially no banding artifacts occur in the image.

11. Apparatus according to claim 7, wherein each of the RF excitation pulses generates a flip angle greater than about 70°.

12. Apparatus according to claim 7, wherein the object comprises body fluids and soft tissues, and wherein the image of the object comprises respective regions corresponding to the body fluids and the soft tissues having high contrast between the regions.

13. Apparatus for magnetic resonance imaging (MRI), comprising:

a magnetic fluid generator which is adapted to impose N sets of steady-state free precession (SSFP) sequences on an object to be imaged, the sequences comprising respective initial radio-frequency (RF) excitation pulses, each initial RF excitation pulse having a predetermined phase shift relative to the other initial RF excitation pulses, wherein N is a value chosen from a set of whole numbers larger than one and less than six, and wherein the phase shift of the RF pulse of an sequence is substantially equal to $$\frac{2\pi(M-1)}{N}$$

radians, wherein M is chosen from a set of whole numbers larger than 0 and less than or equal to N;

a signal processor which is adapted to receive a respective set of image signals from the object responsive to the N sets of SSFP sequences, and to process the set of received image signals so us to generate an image of the object; and wherein the object comprises water and fat, and wherein the magnetic field generator is adapted to:

set a frequency of a frequency synthesizer generating the N sets of SSFP sequences to be substantially equal to an average of a water resonance frequency $v_W$ and a fat resonance frequency $v_F$;

set a repetition time (TR) of each of the sequences to be substantially equal to a first odd integral of a time period τ, wherein $$\tau = \frac{1}{2(v_F - v_W)};$$

and wherein the signal processor is adapted to:

receive a first set of image signals at a first readout time substantially equal to a second odd integral of the time period τ and less than the first odd integral;

receive a second Set of image signals at a second readout time substantially equal to the second odd integral incremented by τ;

process the first and the second set of image signals to form respective processed first and second signals; and generate a water image and a fat image responsive to the first processed signals and the second processed signals.

14. Apparatus according to claim 13, wherein the signal processor is adapted to:

combine the image signals to form a first linear combination and a second linear combination thereof; and generate the image by averaging a first magnitude of the first linear combination and a second magnitude of the second linear combination.

15. Apparatus according to claim 14, wherein the signal processor is adapted to per-form a Fourier transform on each of the image signals and to combine the Fourier transforms.

16. Apparatus according to claim 13, wherein at least some of the image signals are dependent on an angle of precession Φ, and wherein the image of the object is substantially independent of Φ, so that substantially no banding artifacts occur in the image.

17. Apparatus according to claim 13, wherein each of the RF excitation pulses generates a flip angle greater than about 70°.

18. Apparatus according to claim 13, wherein the object comprises body fluids and soft tissues, and wherein the image of the object comprises respective regions corresponding to the body fluids and the soft tissues having high contrast between the regions.

19. A method for magnetic resonance imaging (MRI), comprising:

imposing N sets of steady-state free precession (SSFP) sequences on an object to be imaged, the sequences comprising respective initial radio-frequency (RF) excitation pulses, each initial RF excitation pulse having a predetermined phase shift relative to the other initial RF excitation pulses, wherein N is a value chosen from a set of whole numbers larger than one and less than six;

setting the phase shift of the RF pulse of the sequences so that the phase shift of the RF pulse of an M$^{th}$ sequence is substantially equal to $$\frac{2\pi(M-1)}{N}$$

radians, wherein M as a value chosen from a set of whole numbers larger than 0 and less than or equal to N;

receiving a respective set of image signals from the object responsive to the N sets of SSFP sequences; and processing the set of received image signals so as to generate an image of the object, wherein the object comprises a region having a resonant frequency varying by a factor Δf, and wherein a repetition time (TR) of each sequence of the N sets of SSFP sequences comprises a time greater than a reciprocal of 2Δf.

20. A method according to claim 19, wherein processing the set of received image signals comprises:

combining the image signals to form a first linear combination and a second linear combination thereof; and generating the image by averaging a first magnitude of the first linear combination and a second magnitude of the second linear combination.

21. A method according to claim 20, wherein processing the set of received image signals comprises performing a Fourier transform on each of the image signals, and wherein combining the image signals comprises combining the Fourier transforms.

22. A method according to claim 19, wherein at least some of the image signals are dependent on an angle of precession Φ, and wherein the image of the object is substantially independent of Φ, so that substantially no banding artifacts occur in the image.

23. A method according to claim 19, wherein each of the RF excitation pulses generates a flip angle greater than about 70°.

24. A method according to claim 19, wherein the object comprises body fluids and soft tissues, and wherein the image of the object comprises respective regions corresponding to the body fluids and the soft tissues having high contrast between the regions.

25. A method for magnetic resonance imaging (MRI), comprising:

imposing N sets of steady-state free precession (SSFP) sequences on an object to be imaged, the sequences comprising respective initial radio-frequency (RF) excitation pulses, each initial RF excitation pulse having a predetermined phase shift relative to the oilier initial RF excitation pulses, wherein N is a value chosen from a set of whole numbers larger than one and less than six and wherein the first SSFP sequence in each of the N sets of sequences is preceded by a de-phasing magnetic gradient and an RE pre-pulse which generates a flip angle substantially equal to 90°, setting the phase shift of the RF pulse of the sequences so that the phase shift of the RF pulse of an M$^{th}$ sequence is substantially equal to $$\frac{2\pi(M-1)}{N}$$

radians, wherein M is a value chosen from a set of whole numbers larger than 0 and less than or equal to N;

receiving a respective set of image signals from the object responsive to the N sets of SSFP sequences; and processing the set of received image signals so as to generate an image of the object.

26. A method for magnetic resonance imaging (MRI), comprising:

imposing N sets of steady-state free precession (SSFP) sequences on an object to be imaged, the sequences comprising respective initial radio-frequency (RE) excitation pulses, each initial RE excitation pulse having a predetermined phase shill relative to the other initial RF excitation pulses, wherein N is a value chosen from a set of whole numbers larger than one and less than six;

setting the phase shift of the RE pulse of the sequences so that the phase shift of the RF pulse of an M$^{th}$ sequence is substantially equal to $$\frac{2\pi(M-1)}{N}$$

radians, wherein M is a value chosen from a set of whole numbers larger than 0 and less than or equal to N;

receiving a respective set of image signals from the object responsive to the N sets of SSFP sequences; and processing the set of received image signals so as to generate an image of the object, wherein the object comprises water and fat;

setting a frequency of a frequency synthesizer generating the N sets of SSFP sequences to be substantially equal to an average of a water resonance frequency $v_W$ and a fat resonance frequency $v_F$;

setting a repetition time (TR) of each of the sequences to be substantially equal to a first odd integral of a time period τ, wherein $$\tau = \frac{1}{2(v_F - v_W)};$$

and wherein receiving the respective set of image signals comprises:

receiving a first set of image signals at a first readout time substantially equal to a second odd integral of the tune period τ and less than the first odd integral; and receiving a second set of image signals at a second readout time substantially equal to the second odd integral incremented by τ; and wherein processing the set of received image signals comprises:

processing the first and the second set of image signals to form respective processed first and second signals; and generating a water image and a fat image responsive to the first processed signals and the second processed signals.

27. A method for magnetic resonance imaging (MRI), comprising:

imposing N sets of steady-state free precession (SSFP) sequences on an object to be imaged, the sequences comprising respective initial radio-frequency (RF) excitation pulses, each initial RF excitation pulse having a predetermined phase shift relative to the other initial RE excitation pulses wherein N is a value chosen from a set of whole numbers larger than one and less than six;

setting the phase shift of the RE pulse of the sequences so that the phase shift of the RE pulse of an $M^{th}$ sequence is substantially equal to $$\frac{2\pi(M-1)}{N}$$

radians, wherein M is a value chosen from a set of whole numbers larger than 0 and less than or equal to N;

receiving a respective set of image signals substantially absent of signals from the object responsive to the sets of SSFP sequences, wherein at least a portion of the image signals is dependent on an angle of precession Φ; and processing the set of received image signals so as to generate an image of the object, wherein the image of the object is substantially independent of Φ.

28. The method of claim 27 wherein N is a value of two.

29. A method for magnetic resonance imaging (MRI), comprising:

creating a gradient field about an object to be imaged, the gradient field having a field strength greater than 1.5T;

imposing N sets of steady-state free precession (SSFP) sequences on the object to be imaged, the sequences comprising respective initial radio-frequency (RF) excitation pulse and occurring during a repetition time (TR), each initial RF excitation pulse having a predetermined phase shift relative to the other initial RF excitation pulses, wherein N is a value chosen from a set of whole numbers larger than one and less than six and wherein the TR of each sequence is unrestricted;

setting the phase shift of the RE pulse of the sequences so that the phase shift of the RF pulse of an $M^{th}$ sequence is substantially equal to $$\frac{2\pi(M-1)}{N}$$

radians, wherein M is a value chosen from a set of whole numbers larger than 0 and less than or equal to N;

receiving a respective set of image signals from the object responsive to the N sets of SSFP sequences; and processing the set of received image signals so as to generate an image of the object.

30. A method for magnetic resonance imaging (MRI) with water and fat separation, comprising:

imposing N sets of steady-state free precession (SSFP) sequences on an object to be imaged, the sequences comprising respective initial radio-frequency (RF) excitation pulses, each initial RF excitation pulse having a predetermined phase shift relative to the other initial RF excitation pulses, wherein N is a value chosen from a set of whole numbers larger than one and less than six;

setting the phase shift of the RE pulse of the sequences so that the phase shift of the RE pulse of an $M^{th}$ sequence is substantially equal to $$\frac{2\pi(M-1)}{N}$$

radians, wherein M is a value chosen from a set of whole numbers larger than 0 and less than or equal to N; receiving a respective set of image signals without the object responsive to the N sets of SSFP sequences, and processing the set of received image signals so as to generate separate water and fat images of the object.

\* \* \* \* \*

UNITED STATES PATENT AND TRADEMARK OFFICE
CERTIFICATE OF CORRECTION

PATENT NO. : 6,714,807 B2
DATED : March 30, 2004
INVENTOR(S) : Yuval Zur

It is certified that error appears in the above-identified patent and that said Letters Patent is hereby corrected as shown below:

Column 14,
Line 25, delete the word "front" and substitute therefore -- from --;
Line 47, delete the word "flint" and substitute therefore -- first --;
Line 60, delete the word "die" and substitute therefore -- the --;

Column 15,
Line 5, delete the word "Imaged" and substitute therefore -- imaged --;
Line 61, insert -- $M^{th}$ -- after "an";

Column 16,
Line 26, delete the word "Set" and substitute therefore -- set --;

Column 17,
Line 49, delete the word "oilier" and substitute therefore -- other --;
Line 54, delete "RE" and substitute therefore -- RF --;

Column 18,
Line 7 and 65, delete "(RE)" and substitute therefore -- (RF) --;
Line 8, delete "RE" and substitute therefore -- RF --;
Line 9, delete the word "shill" and substitute therefore -- shift --;
Line 13, delete "RE" and sustitute therefore -- RF --;
Line 45, delete the word "tune" and substitute therefore -- time --;

UNITED STATES PATENT AND TRADEMARK OFFICE
CERTIFICATE OF CORRECTION

PATENT NO.    : 6,714,807 B2
DATED         : March 30, 2004
INVENTOR(S)   : Yuval Zur It is certified that error appears in the above-identified patent and that said Letters Patent is hereby corrected as shown below:

<u>Column 19,</u>
Line 1, 2, and 33, delete "RE" and substitute therefore -- RF --;

<u>Column 20,</u>
Line 21 and 22, delete "RE" and substitute therefore -- RF --;

Signed and Sealed this

Thirteenth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,714,807 B2
DATED : March 30, 2004
INVENTOR(S) : Zur, Yuval

It is certified that error appears in the above-identified patent and that said Letters Patent is hereby corrected as shown below:

Column 14,
Line 55, insert -- 2 -- after "claim";

Column 20,
Line 31, delete "without" and substitute therefore -- from --.

Signed and Sealed this

Ninth Day of November, 2004

JON W. DUDAS
*Director of the United States Patent and Trademark Office*